Dec. 7, 1965 R. J. SANFORD 3,222,548

RF PROTECTION CIRCUIT

Filed Sept. 30, 1963

INVENTOR.
Richard J. Sanford
BY
ATTORNEY.

United States Patent Office 3,222,548
Patented Dec. 7, 1965

3,222,548
RF PROTECTION CIRCUIT

Richard J. Sanford, Silver Spring, Md., assignor to the United States of America as represented by the Secretary of the Navy Filed Sept. 30, 1963, Ser. No. 312,805
4 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

The present invention relates to electrical circuitry used to protect various circuit elements against unwanted R-F energy and more specifically is directed to an R-F protection circuit which employs a controlled rectifier as a low pass filter.

In the past RC filters have been used to attenuate R-F energy and to prevent spurious R-F signals from reaching certain circuit elements. These RC filters present a large resistance to direct current unless excessively large capacitors are used. Large capacitors are either bulky and heavy or are ineffective at radio frequencies. The LC filter has also been used to protect circuit elements against low radio frequencies, but the inductors of such filters have, for the most part, been excessively bulky and heavy.

The present invention is designed to overcome the aforedescribed disadvantages of prior art filters and comprises a silicon controlled rectifier having input, output, and control electrodes and a resistance-capacitance network connected to the input and control electrodes which enables the silicon controlled rectifier to pass direct current between input and output and prevent an R-F input signal from reaching the output.

An object of the present invention is to provide an electrical circuit capable of protecting various circuit elements against R-F energy.

Another object of the present invention is to provide a new and improved R-F filter network capable of attenuating R-F energy and preventing the same from reaching circuit elements desired to be protected therefrom.

A further object of the invention is to provide a low pass filter which presents low series resistance to direct current and avoids the use of bulky or heavy capacitors or inductors.

Figure 1:
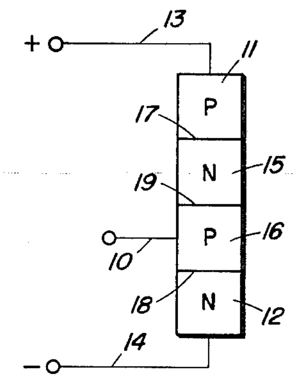
Figure 2:
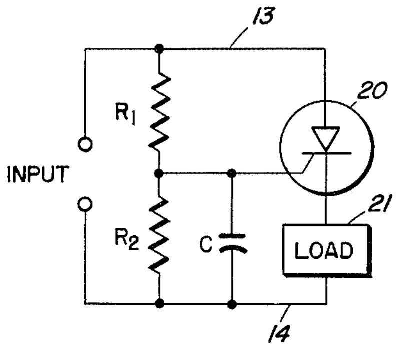

Other objects and many of the attendant advantages of this invention will be readily apparent from a consideration of the following specification relating to the annexed drawing in which:

FIG. 1 illustrates a controllable, multi-junction, semiconductor directional conducting device which may be used to achieve the objects of the invention, and FIG. 2 is a schematic illustration of the R-F protection circuit of the present invention.

Referring to FIG. 1, there is shown a controlled rectifier consisting of four contiguous zones of semi-conducting material. The outside zone 11 is a P-type semiconducting material, while the second end or outside zone 12 is an N-type semi-conducting material. The device includes intermediate zones 15 and 16 of N-type and P-type semi-conducting materials, respectively. The first conductor 13 is connected to the first end zone 11 so as to have an ohmic connection therewith, and second conductor 14 has an ohmic connection with N-type material 12. A third conductor 10 has an ohmic connection with the P-type material forming zone 16 and a device of this type is commonly referred to as controlled rectifier. If a source of unidirectional potential is applied between conductors 13 and 14 making the first zone 11 of P-type material positive with respect to the second end zone 12 of N-type material, then the outer junctions 17 and 18 are forwardly biased and junction 19 is reversely biased. However, even with the outer junctions 17 and 18 forwardly biased, the device will not normally conduct because the inner junction 19 is reversely biased and passes only a small leakage current. The reverse bias across junction 19 establishes in that junction an electric field which accelerates electrons into zone 16 and holes into zone 15. If electrons and/or holes are introduced into junction 19, conduction through the device will occur. Electrons may be introduced into junction 19 by applying a source of potential between conductors 10 and 14, making zone 16 positive with respect to zone 12. This forward biases junction 18 and causes electrons to flow from zone 12 into zone 16. Many of these electrons diffuse into the electric field of junction 19; they are then accelerated into zone 15. There they forward bias junction 17 and cause holes to flow from zone 11 into zone 15. Some of these holes are accelerated across junction 19 into zone 16, further increasing the forward bias of junction 18. This again increases the current through junction 17, and so on until the current is limited only by the resistance in the circuit and by the voltage drops of the forward biased junctions. Where conduction is brought about by the flow of gate current from third conductor 10 to the second end zone 12, the third conductor 10 may be considered a gate or control electrode.

The controlled rectifier of FIG. 1 is represented as 20 in FIG. 2 and where silicon is used as a semi-conducting material the device 20 is commonly referred to as a silicon control rectifier (SCR). The circuit of FIG. 2 is effective to pass direct current between input terminals 13 and 14 and load 21 and prevent an R-F input signal from reaching the output load 21. The load 21 may, if desired, be connected in the anode circuit of FIG. 2 between the upper terminal of resistor R1 and the anode of the controlled rectifier device 20. With such a connection, any circuit element would be protected against spurious R-F signals applied to the input terminals similar to the case where the circuit element is connected in the cathode circuit.

The operation of the device of FIG. 2 when subjected to D.C. and R-F signals is described as follows. When a D.C. signal is applied to the input terminals 13 and 14 it is delayed by the $R_1C$ filter by an amount equal to the time constant of said filter. After a short interval, a sufficient voltage is built up on the upper plate of capacitor C to fire the SCR 20, allowing the input signal to pass through the circuit to the output load 21. If, however, an R-F signal is applied to the input terminals 13 and 14, the $R_1C$ filter attenuates the R-F and prevents it from firing the SCR 20. During the application of an R-F signal at terminals 13 and 14, the voltage attained on the upper plate of capacitor C is insufficient to fire the SCR 20. $R_2$ is a bias resistor and is used to stabilize the SCR 20. If a D.C. voltage of sufficient magnitude to fire the SCR 20 and spurious R-F signals are simultaneously applied to the input terminals of FIG. 2 some R-F will pass to the circuit element 21 desired to be protected from spurious R-F energy. However, most of the R-F passed by the controlled rectifier 20 will be shunted through the capacitor C via the gate electrode of the controlled rectifier 20.

Thus there has been provided a simple, low-pass filter which is easy to construct and which presents low series resistance to D.C. while avoiding the use of bulky or heavy capacitors or inductors.

Various modifications of this circuit may be made without departing from the spirit and scope of the invention.

For example, the load 21 may be connected between the anode of the rectifier 20 and the filter, and also, in the case of low impedance loads, between either of the input terminals and the filter if the filter impedance is high relative to the load impedance. Also, additional filters may be used to extend the range of protection if desired. The RC filter coupled to the input of the controlled rectifier may be replaced by an LC filter or any other low-pass filter network by one skilled in the art, provided the necessary coupling is present between the gate electrode of device 20 and a terminal of the low-pass filter capable of attaining a sufficient D.C. voltage to fire the SCR 20. It is therefore to be understood, that within the scope of the appended claims, the invention may be practiced otherwise than as specifically described.

What is claimed is:

1. An electrical circuit designed to protect circuit elements against R-F energy comprising:

a controlled rectifier having an anode, a cathode, and a gate electrode, first and second input terminal means for receiving D.C. and R-F signals, said first input terminal means connected to said anode, first and second resistors connected in series between said first and second input terminal means, capacitor means having a first plate thereof connected to the junction point of said resistors and said gate electrode and the second plate thereof connected to said second input terminal means, and output terminal means connected to the cathode electrode for supplying only D.C. signals to a load connectable between said output terminal means and said second input terminal means when both D.C. and spurious R-F signals are present at said input terminal means, said capacitor means and said first resistor providing R-F signal blocking thereby preventing any spurious R-F signal from firing said controlled rectifier.

2. The electrical circuit of claim 1 wherein:

said first resistor and said capacitor means are connected in series for delaying the firing of said control rectifier a time necessary for the voltage on said first plate of said capacitor means to reach a predetermined value, said second resistor being connected in parallel with said capacitor means to provide a bias at the gate electrode for stabilizing said controlled rectifier.

3. An electrical circuit designed to protect various circuit elements against spurious R-F energy which comprises:

a controlled rectifier having an anode, a cathode, and a gate electrode, a low pass filter network, first and second input terminal means for receiving D.C. and R-F signals, said first input terminal means coupled to said anode electrode and to said low pass filter network, said second input terminal means directly connected to said low pass filter network, means for connecting a circuit element desired to be protected against spurious R-F energy between said cathode and said filter circuit, conductive means connecting one terminal of said low-pass filter circuit to said gate electrode for establishing an electrical potential thereat sufficient to fire said controlled rectifier upon receipt of a predetermined D.C. voltage at the input of said low-pass filter circuit, said low-pass filter circuit operable to by-pass R-F energy received at the input thereof and render the potential of said gate electrode insufficient to fire said controlled rectifier whereby said R-F energy will be blocked by said controlled rectifier and prevented from reaching said circuit element.

4. The electrical circuit of claim 3 wherein:

said low-pass filter includes an RC network connected between the anode and cathode of said controlled rectifier, said conductive means being connected to the junction of said resistance and capacitance and to said gate electrode.

References Cited by the Examiner

UNITED STATES PATENTS

| | | | |
|---|---|---|---|
| 3,128,455 | 4/1964 | Snell | 307—88.5 X |
| 3,143,706 | 8/1964 | Michael | 325—362 |

DAVID J. GALVIN, *Primary Examiner.*

ARTHUR GAUSS, *Examiner.*